(12) United States Patent
Putnam

(10) Patent No.: US 7,482,533 B2
(45) Date of Patent: *Jan. 27, 2009

(54) NUCLEAR-CORED BATTERY

(75) Inventor: Everly Dean Putnam, Des Moines, IA (US)

(73) Assignee: Medusa Special Projects, LLC, Tucson, AZ (US)

( * ) Notice: Subject to any disclaimer, the term of this patent is extended or adjusted under 35 U.S.C. 154(b) by 540 days.

This patent is subject to a terminal disclaimer.

(21) Appl. No.: 11/142,070

(22) Filed: Jun. 1, 2005

(65) Prior Publication Data

US 2006/0185719 A1   Aug. 24, 2006

Related U.S. Application Data

(60) Provisional application No. 60/655,972, filed on Feb. 22, 2005.

(51) Int. Cl.
*H01L 31/00* (2006.01)

(52) U.S. Cl. .................. 136/253; 136/252; 136/254

(58) Field of Classification Search ............ 136/252, 136/253, 202; 252/301.4, 301.6, 600
See application file for complete search history.

(56) References Cited

U.S. PATENT DOCUMENTS

| | | | | |
|---|---|---|---|---|
| 3,031,519 A | * | 4/1962 | Silverman | ............ 136/253 |
| 3,094,634 A | * | 6/1963 | Rappaport | ............ 310/303 |
| 3,795,524 A | | 3/1974 | Sowman | |
| 3,945,898 A | | 3/1976 | Tsuji et al. | ............ 313/311 |
| 3,950,668 A | | 4/1976 | Mattis et al. | |
| 3,980,887 A | | 9/1976 | Mattis et al. | |
| 4,035,819 A | * | 7/1977 | Nitta et al. | ............ 257/43 |
| 4,151,325 A | | 4/1979 | Welch | ............ 428/432 |
| 4,242,147 A | | 12/1980 | De Toia | |
| 4,308,844 A | | 1/1982 | Persinger | |
| 4,402,888 A | | 9/1983 | Runck | ............ 264/448 |
| 4,499,833 A | | 2/1985 | Grantham | |
| 4,801,398 A | | 1/1989 | Ohno et al. | |

(Continued)

FOREIGN PATENT DOCUMENTS

JP   404100584 A   4/1992

(Continued)

OTHER PUBLICATIONS

D.E. Carlson, C.R. Wronski, Amorphous Silicon Solar Cell, Applied Physics Letters, vol. 28, No. 11, 1976, 671-673.*

(Continued)

*Primary Examiner*—Nam X Nguyen
*Assistant Examiner*—Bach T Dinh
(74) *Attorney, Agent, or Firm*—Hayes Soloway P.C.

(57) ABSTRACT

A nuclear-cored battery having a spherical core that emits radiation and is surrounded by a ceramic phosphor material having a structural defect such that the ceramic material within the ceramic phosphor material is used to shield and absorb the radiation emitted by the nuclear core while the phosphors are excited by the radiation causing them to produce energy in the form of photons. Surrounding the ceramic phosphor material is a photovoltaic layer that transforms the photons into a flow of electrons to create an energy source in the form of a sphere. A P and N layer sandwiches a plurality of spheres therebetween to harness the electron flow created by the photovoltaic layers of the spheres.

18 Claims, 10 Drawing Sheets

U.S. PATENT DOCUMENTS

| | | | |
|---|---|---|---|
| 4,892,684 | A | 1/1990 | Harp |
| 5,008,579 | A | 4/1991 | Conley et al. |
| 5,077,241 | A | 12/1991 | Moh et al. |
| 5,082,505 | A | 1/1992 | Cota et al. |
| 5,235,232 | A | 8/1993 | Conley et al. |
| 5,376,303 | A | 12/1994 | Royce et al. |
| 5,396,141 | A | 3/1995 | Jantz et al. |
| 5,424,006 | A | 6/1995 | Murayama et al. |
| 5,443,657 | A | 8/1995 | Rivenburg et al. |
| 5,597,623 | A | 1/1997 | Takai et al. ............... 427/575 |
| 5,605,171 | A | 2/1997 | Tam |
| 5,606,213 | A | 2/1997 | Kherani et al. |
| 5,721,462 | A | 2/1998 | Shanks |
| 5,852,346 | A | 12/1998 | Komoda et al. |
| 5,859,484 | A | 1/1999 | Mannik et al. |
| 5,885,483 | A | 3/1999 | Hao et al. |
| 6,010,644 | A | 1/2000 | Fu et al. |
| 6,013,313 | A | 1/2000 | Nunan et al. |
| 6,117,362 | A | 9/2000 | Yen et al. |
| 6,133,522 | A * | 10/2000 | Kataoka et al. ............ 136/259 |
| 6,207,229 | B1 | 3/2001 | Bawendi et al. |
| 6,322,901 | B1 | 11/2001 | Bawendi et al. |
| 6,479,743 | B2 | 11/2002 | Vaz |
| 6,617,781 | B2 | 9/2003 | Murazaki et al. ........... 313/486 |
| 6,846,565 | B2 | 1/2005 | Korgel et al. |
| 6,851,413 | B1 | 2/2005 | Tamol, Sr. |
| 6,911,394 | B2 | 6/2005 | Jiang et al. ................. 438/687 |
| 2001/0043042 | A1 | 11/2001 | Murazaki |
| 2002/0195089 | A1 | 12/2002 | Zetmeir |
| 2003/0026989 | A1 | 2/2003 | George et al. |
| 2003/0183807 | A1 | 10/2003 | Shankar |
| 2003/0209447 | A1 | 11/2003 | Andrews |
| 2003/0219544 | A1 | 11/2003 | Smith et al. |
| 2003/0222247 | A1 | 12/2003 | Putnam |
| 2004/0121073 | A1 | 6/2004 | George et al. |
| 2004/0150290 | A1 | 8/2004 | Gadeken |
| 2005/0001040 | A1 | 1/2005 | Berstis |
| 2006/0060464 | A1 | 3/2006 | Chang ....................... 204/164 |
| 2006/0185719 | A1 | 8/2006 | Putnam ..................... 136/253 |

FOREIGN PATENT DOCUMENTS

| | | |
|---|---|---|
| JP | 411114359 | 4/1999 |
| JP | 2001-250507 | 9/2001 |
| JP | 02001314753 | 11/2001 |
| WO | WO 2003 096767 | 5/2003 |

OTHER PUBLICATIONS

Zinc Sulfide, ZnS, Wurtzite. Datasheet [online]. MatWeb [retrieved on Jan. 8, 2008]. Retrieved from the internet: <URL:http://www.matweb.com/search/DataSheet.aspx?MatID=3084&ckck=1>.*

$4f^n$—$4f^n$—$^1 5d$ transitions of the trivalent lanthanides: experiment and theory, Journal of Luminescence (2001) L. Van Pieterson; M. F. Reid; R. T. Weigh; A. Meijerink.

$4f^n$—$4f^n$—$^1 5d$ Transitions of the Heavy Lanthanides Experiment and Theory.

Advances in the development of lanthanide macrocyclic complexes as luminescent biomarkers. Preprint SPIE Procs. Series. vol. 2678, Optical Diagnosis of Living Cells and Biofluids, Advanced Techniques in Analytical Cytology, Ed. D. L. Farkas, R. C. Leif, A. V. Priezzhev, T. Askuira and B. Tromberg. A. Katzir Biomedical Optics Series Editor, p. 1 of 10 (1966).

Thermoluminescence response to aluminum oxide thin films to beta-particle and UV radiation, Superficies y Vacio, vol. 13, 126-129, Dec. 2001; Villarreal-Barajas; Escobar-Alarcon; Camps, Gonzalez, Villagran and M. Barboza-Flores, Mexico.

Application of DC thermal plasma in synthesis of nonoenergetic materials.

Applied Scintillation Technologies, Phosphors, Distributed by Apace Science.

Light Emitting Material.

Long Life Power Source, Microelectronics Research Center, Iowa State University, Ames, Iowa, Howard R. Shanks.

Characteristics of Ferromagnetic Flux Focusing Lens in the Development of Surface/Subsurface Flaw Detector; Wincheski; Fulton; Nath; Namkung; and Simpson.

Chemical Vapor Deposition of Silicon Dioxide by Direct-Current, Corona Discharges in Air Containing Octamethylcyclotetrasiloxane; Vapor Part II, Model, Chen and Davidson, Dept. of Mechanial Engineering, University of Minnesota, Minneapolis, MN 55455.

Chemical Vapor Deposition of Silicon Dioxide by Direct-Current, Corona Discharges in Air Containing Octamethylcyclotetrasiloxane; Vapor Part I Measurments of the Deposition Rate Chen and Davidson, Dept. of Mechanial Engineering, University of Minnesota, Minneapolis, MN 55455.

Chemiluminescence of lanthanide beta-diketonates excited from decomposition of 1, 2-dioxetane.

Cold Plasma Reactor with Dielectric Barrier Discharge, T. Opalinska, Industrial Chemistry Research Institution, Poland.

Fine-Tuning of the Chromaticity of the Emission Color of Organic-Inoganice Hybirds Co-Doped with $Eu^{III}$, $Tb^{III}$, and $Tm^{III}$, Carlos, Ferreira, Rainho and Bermudez, 2002, 12, No. 11-12 Dec. Weinheim, Germany.

Creation of trapped electrons and holes in alkaline-earth fluoride crystals doped by rare-earth ions; Journal of Physics Condensed Matter, Matter 13 (2001) 10955-109557, printed in UK.

The Effects of Substrate Material and Thermal Processing Atmosphere on the Strength of PS304: A High Temperature Solid Lubricant Coating; Christopher Della Corte, Glenn Research Center, Cleveland, Ohio—Sep. 2002.

Electron-phonon coupling and pair interactions of transition metal ions, PhD research of Dr. A. P. Vink from Jan. 1, 1996 to May 10. 2000.

Enhanced emission from Eu (III) B-diketone complex with ether-type oxygen atoms of di-ureasil organic-inoganiz hybirds; Molina, Dahmouche, Messaddeq, Ribeiro, Silva, Bermudez and Carlos; Brazil, France and Portugal; Dec. 2, 2002.

Enlargment of Glass and Plastic Shells to 1 mm In Diameter by Redropping Through a Short Headed Towner; Nikroo and Steinman, Jun. 1988, San Diego, California.

Experimental Research of the Magnetic-Gravity Effects, Roschin and Godin, Institute of High Temperatures, Russian Academy of Science.

First Oxadiazole-Functionalized Terbium (III) B-Dicketonate for Organic Electroluminescence, Jiafu Wang; Ruiyao Wang; Yang; Zheng; Carducci; Cayou; Peyghambarian and Zabbour; Department of Chemistry and Optical Sciences Center; University of Arizona, Tucson, Arizona—Nov. 29, 2000.

Luminescence of $re^{2+}$ (re=Sm, Yb) in barium octoborate; Zeng, Pei, Wang, Su and Lu; China, Aug. 5, 1998.

Luminescent properties of $Al_2O_3$: Tb thin films deposited by spray pyrolysis; A. Garcia; M Garcia; Falcony; Nieto, Mexico, Superficies y Vacio, Vacto II, 80-83—Dec. 2000.

The Hexachlorelpasolite System, Matthew Duckett 1997.

Metal-organic vapor phase epitaxial growth of high-quality ZnO films on $Al_2O_3$ (00.1); Park; An; Yi and Jang; Department of Materials Science and Engineering, Pohang University of Science and Technology, Pohang, Korea.

Methods to Increase the Lumiescence of Lanthanide (III) Macrocyclic Complexes; Quagliiano, Leif; Vallarino; Williams; New Mexico, California and Virginia—Preprint SPIE BIOS Proceeding vol. 3921.

Modeling of the Turbulent Flow in HEV Static Mixers; Bakker an LaRoche, published in The Online CFM Book—1998.

Novel Plasma Methanol Decomposition to Hydrogen Using Corona Discharges, Zou, Zhang and Liu, Chemistry Letters vol. 22, No. 6—China—Feb. 27, 2004.

Cert 103 Notes, Shelby Chapter 10, Optical Properties, R. K. Brow.

Panasonic, Solar Cells Technical Handbook '98/99, Matsushita Battery Industrial Co., Ltd., Aug. 1998.

ATI120—Auto Tune Inverter, Plasma Technics, Inc., Racine, Wisconsin.

Elite Edge Installation and Owner's Manual, Merit Industries, Inc., 2005.

Transforming Conventional Printing for the Future, TAGA Microtech Forum, University of Chicago, Chicago, Ill, Oct. 7-8, 2002.

Production and Properties of Fulleren-based Materials, SRI International, July 19, 2005.

100 HE, Advanced Coating Technology, High Velocity Air Plasma System, Progressive Technologies, Grand Rapids, Michigan, 2003.

The Use of Tritium in Plastic Watches, Public Health Division, Department of Human Services, Victoria, Australia, Jul. 19, 2005.

Red light emission by photoluminescence and electroluminescence from Eu-doped GaN, Heikenfeld, Garter, Lee, Birkhahn and SteckIAmerican Institute of Physics, vol. 75, No. 9, Aug. 1999.

Sensitization of Lanthanide Luminescence.

Speed and Decay of Cosmic Ray Munos, Romero and Vengalattore, Massachsetts Institute of Technology, Cambridge, Massachusetts, Apr. 19, 1998.

9 Summary, Samenvatting.

Synthesis, Characterization, and Luminescence of B-Cyclodextrin Inclusion Compounds Containing Europlum (III) and Gadolinium (III) Tis(B-diketonates), Braga, Ferreira, Gonclaves, Pillinger, Rocha, Teixeira and Carlos, Portugal, Feb. 11, 2002.

The Lanthanides and Their Complexes.

Surface Engineering and Wear, Chapter 1 and Chapter 2, The Theory and Application of the HVOF Thermal Spray Process.

Trends in parameters for the $4f^n$—$4f^{n-1}$ 5d spectra of lanthanide ions in crystals; Reid, Van Peterson and Meijerink, University of Canterbury, New Zealand, 2002.

Visible Luminescent Activation of Amorphous AIN:EU Thin-Film Phosphors with Oxygen; Caldwell, Van Patton, Kondesch, and Richardson, 2001 The Materials Research Society, MRS Internet J. Nitride Semicond. Res. 6, 13 (2001).

Water enhances photoluminescence intensity of europium (III), terbium (III) and samarium (III) tris-B-diketonates in toluence solutions and chemiluminescence intensity of europium (III) and samarium (III) tris-B-diketonates in the reaction with dioxetane, Voloshin, Shavaleev, Kazakov, Institute of Organic Chemistry, Russia—Apr. 10, 2000.

The orgin of colors in metals, semiconductors and insulators; Reference: Materials in today's world, $2^{nd}$ Ed., Peter A. Thrower, © 1996 McGraw-Hill Inc.

Advanced inorganic chemistry, a comprehensive text; F. Albert Cotton and Geoffrey Wilkinson, F.R.S.; Second Revised and Augmented Ed.; Interscience Publishers, Div. of John Wiley & Sons.

Effect of yttrium and lanthanum on the final-stage sintering behavior of ultrahigh-purity alumina; Journal of the American ceramic Society, vol. 80, No. 8. Aug. 1997; Jianxin Fang, A. Mark Thompson, Martin P. Harmer, and Helen M. Chan.

Photo- and cathodoluminescence in cerium-activated yttrium-aluminium borates; Mat. Res. Soc. Proc. vol. 621 © 2000 Materials Research Society.

The role of lanthanides in optical materials, Marvin J. Weber; reprinted from ceramic transactions, vol. 67, 1996; Copyright © 1996 by the American Ceramic Society.

Luminescence imaging of surface cracks and surface-density gradients in alumina; C.H. Schilling, V. Garcia and R. Jankowiak; American Ceramic Society Bulletin, vol. 81, No. 1.

Photonic crystals (Nano-science thechnology; Kibum Nam; http://www.phys.ksu.edu/~namkv/photonic.html.

Epoxy-based electroactive polymer gels; Yuka Yoshioka and Paul Calvert;Experimental Mechanics, vol. 42, No. 4, Dec. 2002.

Actuators based on electroactive polymers; Hemantkumar Sahoo, Tej Pavoor and Sreekanth Vancheeswaran; Current Science, vol. 81, No. 7, Oct. 10, 2001.

Process maps in plasma spraying, Richard Neiser, Delwyn Gilmore, David Beatty, Xiangyang Jiang, Anand Kulkarni, Jiri Matejicek, and Sanjay Sampath; http://www.matscieng.sunysb.edu/tsl/ctsr/nuggets/nugget22/.

Plasma flame theory, plasma thermal spray coating process; Gordon England; http://www.gordonengland.co.uk/pft.htm; Thermal Spray Coating Industry.

Thermal spray coatings for industrial applications, William Lenling and David Ohmann; Thermal Spray Technologies, Inc.; http://www.tstcoatings.com/paperndes2000.htm; Aug. 30, 2004.

Metal fabrication thermal spraying; Copyright © 1996-2004 by Air Products and Chemical, Inc.

Plasma Processes, powder alloying & spheroidization; Copyright © 2001, Plasma Processes, Inc., Hunstville, Alabama.

Plasma spray synthesis of nanomaterials; CC. Berndt, A.H. King, T. Chraska and J. Karthikeyan; National Science Foundation CTS 9312896, Aug. 30, 2004.

Cadmium chromium (III) selenide, $CdCr_2Se_4$ $4Cd=4Se=2CrCl_3$->$CdCr_2$ $Se_4=3CdCl_2$; Arthur W. Sleight; Central Research Department, E.I. du Pont de Nemours & Company, Wilmington, Del. And RCA Laboratories, Princeton, N.J.

Aero-sol-gel synthesis of nanoporous iron-oxide particles: A potential oxidizer for nanoenergetic materials; Anand Prahash, Alon V. McCormick and Michael R. Zachariah; Depts. Of Mechanical and Chemical Engineering, University of Minnesota.

Aero-sol-gel (ASG) reactor for nano-powder synthesis; G. Beaucage, J. Hyeon-Lee and S.E. Pratsinis; Depts. Materials Science and Engineering and Chemical Engineering, Cincinnati, Ohio.

Ionization Energy; http://dl.clackamas.cc.or.us/ch104-0-7/ionization_energy.htm.

Spray drying fundamentals: Process stages and layouts; Basic principles definitions.

Electron affinity versus Atomic Number; http://www.chm.davidson.edu/ronutt/che115/ea.gif.

First ionization energy versus atomic number; http://www.chm.davidson.edu/ronutt/che11/ie.gif.

Microspheres of $UO_2$, $ThO_2$ and $PuO_2$ for the High Temperature Reactor; Egbert Brandau; Brace GmbH, Alzenau.

Sintering of alumina parts with microwave energy; Kristen H. Brosnan; Dept. of Materials Science and Engineering, Pennsylvania, Aug. 2002.

Hollow alumina microspheres from boehmite sols, M. Chatterjee, D. Enkhtuvshin, B. Siladitya, and D. Ganguli; Central Glass & Ceramic Research Institute Calcutta, India; 1998 Kluwer Academic Publishers.

Hollow alumina microspheres prepared by RF thermal plasma, Zoltan Karoly and Janos Szepvolgyi; Hungarian Academy of Sciences, Budapest, Hungary; Mar. 27, 2003.

Presentation on Study on energy transference between Ce and Mn ions in films of $Al_2O_3$; R. Martinez-Martinez, E. Martinez-Sanchez, M. Garcia-Hipolito, F. Ramos-Brito, O. Alvarez-Fregaso and C. Falcony; Mexico.

Exciton-mediated hydrosilylation on photoluminescent nanocrystalline silicon; Michael P. Stewart and Jillian M. Buriak, Dept. of Chemistry, Purdue univ., West Lafayette, Indiana; May 3, 2001.

Influence of detector electronics on lanthanide's K-emission measurements, Harada and Sakurai, Fukuoka University of Education, 811-4192, Japan; National Institute for Materials Science, 305-0047, Japan.

A Comprehensive Treatise on Inorganic and Theoretical Chemistry, vol. III, Joseph William Mellor; Longmans, Green and Co,; London, New York, Toronto, Apr. 1952.

A Comprehensive Treatise on Inorganic and Theoretical Chemistry, vol. IV, Joseph William Mellor; Longmans, Green and Co.; London, New York, Toronto, Sep. 1946.

A Comprehensive Treatise on Inorganic and Theoretical Chemistry, vol. V, Joseph William Mellor; Longmans, Green and Co.; London, New York, Toronto, Sep. 1946.

A Comprehensive Treatise on Inorganic and Theoretical Chemistry, vol. VI, Joseph William Mellor; Longmans, Green and Co.; London, New York, Toronto, Sep. 1940.

A Comprehensive Treatise on Inorganic and Theoretical Chemistry, vol. X, Joseph William Mellor; Longmans, Green and Co.; London, New York, Toronto, Jun. 1930.

Machine Translation of JP 411114359.

* cited by examiner

NUCLEAR-CORED BATTERY

CROSS REFERENCE TO RELATED APPLICATION

This application is a non-provisional application gaining priority from provisional patent application Ser. No. 60/655, 972 filed Feb. 22, 2005. That provisional is incorporated herein.

BACKGROUND OF THE INVENTION

This application relates to an alternative fuel source. More specifically and without limitation this invention relates to a nuclear-cored battery that is safe for everyday use.

Currently, in the art of batteries, such as car batteries, a battery has a cell with one plate made of lead and another plate made of leaded dioxide and has a strong sulfuric acid electrolyte in which the plates are immersed. From this chemical reaction within the lead acid battery, electrons flow powering whatever device is connected to the battery. Though current lead acid batteries effectively power devices such as automobiles, many problems in the art remain. First, the life expectancy of an average battery in an automobile can be as little as three to four years. Additionally, current car batteries cause inefficiencies within the car motor thus lowering the miles per gallon of gasoline that a car may travel.

Batteries having a nuclear core have been developed to attempt to harness the energy from a long lasting source. The radioactive materials of these batteries have been used with chemicals known as phosphors to create light that can be converted into electricity. Though electricity has been created, because of the radioactive nature of the core material, these batteries are unsafe for everyday use.

Attempts to solve the problem of creating an nuclear-cored battery that is safe for everyday use have been made; however scientist have been unable to find a material that will effectively shield the radioactive radiation of the nuclear core material and yet still produce sufficient light that can be efficiently converted into electricity. Thus, there is a need in the art for an improved nuclear battery.

High temperature ceramics such as $Al_2O_3$, alumina and zirconium oxide in the past have been used to contain radioactive wastes such that these ceramic containers or sarcophaguses have radioactive waste material placed therein and are buried in the ground. A high temperature ceramic is defined as any ceramic material that has a melting point above 2,000 degrees Centigrade. The ceramic structure is stable and dense enough that this structure is not altered by the radioactive radiation. Nonetheless, high temperature ceramics have never been used in the field of nuclear-cored batteries because the dense structure of the ceramics is not conducive to the production of photons using a radioactive source.

Additionally, in the current art of manufacturing processes that have been developed to produce similar crystals to those that will be created in manufacturing the nuclear-cored battery are not conducive to the mass production needed to make a profit in the business community. Specifically, during the production of photoluminescent crystals the manufacturing process requires multiple steps of mixing, milling, and heating material continually. These processes not only take a lot of time and effort, but also produce inferior crystals. Thus, there is a need for a new method of manufacturing crystals that reduces the cost to produce the crystals while increasing the quality of the crystal.

Furthermore, to assist in the manufacturing process of the nuclear-cored battery the current manufacturing equipment that would be used to manufacture the battery cause inefficiencies during the manufacturing process. Specifically, a problem exists with the nano-material production equipment, such as a plasma spray gun that will be used to manufacture the nuclear-cored battery of this disclosure. A problem with current plasma spray guns exists in that these guns use a tungsten anode and electrode that deplete into the plasma stream as the equipment is used, thus limiting the life of the anode and electrode such that current anode and electrodes within a plasma spray gun only last approximately 250 hours. Thus there is a need in the art to improve upon the life of the anode and electrode with a plasma spray gun.

Another technology that may be improved uses a similar solution as will be disclosed regarding the nano-material production equipment and this technology is known as a fuel saver. A fuel saver converts $O_2$ into $O_3$. Currently, alumina plates are placed on top of copper plates thus creating the fuel saver and the combination of these plates are used as discharge plates within the fuel saver. Nonetheless, these fuel saver units known in the art do not yield an optimum output potential. Thus, there is a need for an improved manufacturing process to create a fuel saver, and a need for a more efficient fuel saver.

Thus, the principal object of the present invention is to provide a nuclear-cored battery that is safe for everyday use.

Another object of the present invention is to provide a nuclear-cored battery that will last longer than traditional lead acid batteries.

Yet another object of the present invention is to provide a nuclear-cored battery that is more efficient than a traditional lead acid type battery.

These and other objects, features, or advantages will become apparent from the specification and the claims.

BRIEF SUMMARY OF THE INVENTION

A nuclear-cored battery that emits alpha, beta, or gamma radiation and is surrounded by a ceramic phosphor material. The ceramic material within the ceramic phosphor material is a high temperature ceramic and is used to shield and absorb the radiation emitted by the nuclear core while the phosphors are excited by the radiation causing them to produce energy in the form of photons. Structural defects are used to increase the bandwidth of the ceramic material and phosphor material such that photons are produced and radioactive radiation is prevented from being emitted past the ceramic material. Surrounding the ceramic phosphor material is a photovoltaic layer that transforms the photons into a flow of electrons to create a sphere. Surrounding a plurality of these spheres is a conductive material that is an intermediate layer that carries the spheres. A P and N layer sandwiches the spheres therebetween to harness the electron flow created by the photovoltaic layer to create the nuclear-cored battery.

DETAILED DESCRIPTION OF THE PREFERRED EMBODIMENT

Figure 1:
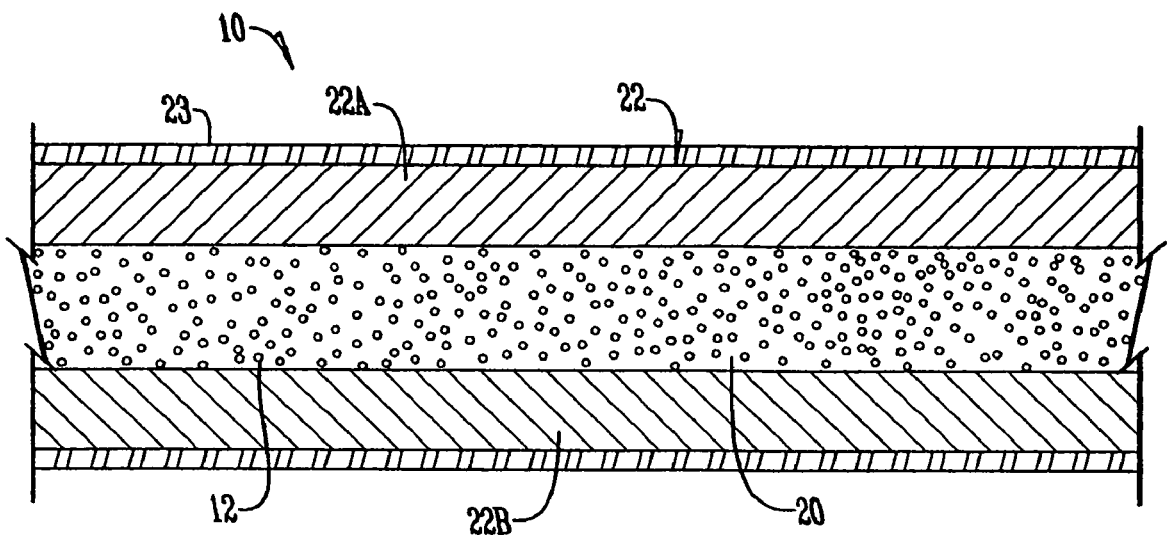
FIG. 1 is a sectional view of a nuclear-cored battery.
Figure 2:
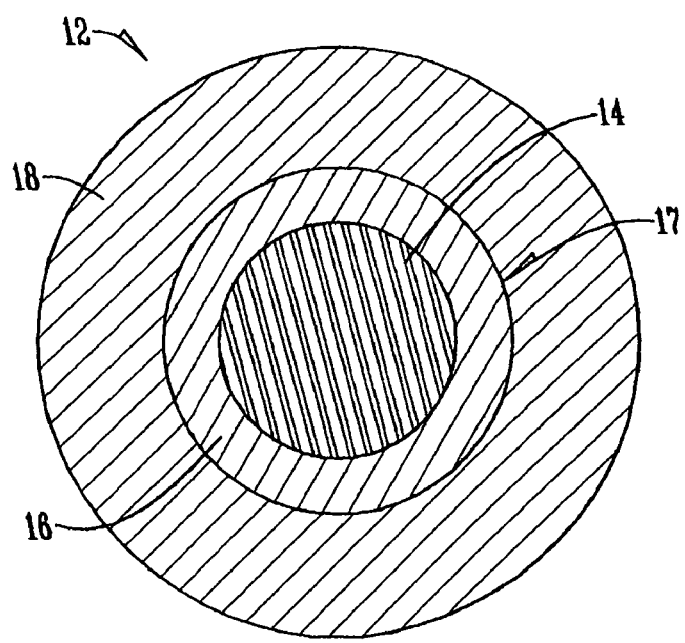
FIG. 2 is a cut away plan view of a sphere of an nuclear-cored battery.

FIG. 1 shows an atomic battery or nuclear-cored battery 10. Nuclear-cored battery 10 is created by producing a plurality of energy sources in the form of spheres 12 (FIG. 2) that each have a nuclear core 14 that emits alpha, beta, or gamma radiation. Nuclear core 14 is comprised of any radioactive material including, uranium, uranium carbonate, uranium oxide, strontium, and strontium oxide.

The nuclear core 14 is surrounded by a ceramic phosphor material 16 that is in one embodiment a crystalline having a carbon defect such that the ceramic phosphor material 16 in combination with the nuclear core forms a light dissipating material 17. In one embodiment, the ceramic phosphor material comprises a high temperature ceramic. In another embodiment this high temperature ceramic comprises a matrix having $Al_2O_3$:C. In yet another embodiment zinc sulfide, or another high temperature ceramic having a carbon defect is used. The ceramic material within the ceramic phosphor material 16 is used to shield and absorb the radiation emitted by the nuclear core 14 while the phosphors are excited by the radioactive radiation of the nuclear core 14 causing the phosphors to produce energy in the form of photons. In another embodiment lanthanides are used as a defect for the phosphors. The carbon defect increases the bandwidth of the ceramic material, and the lanthanides are used to increase the bandwidth of the phosphors. Thus, the ceramic material prevents radiation from being emitted past the ceramic phosphor material 16, yet this material 16 is still able to produce photons.

In one embodiment the ceramic phosphor material 16 is made into a crystalline structure that is an amorphous crystal or a structured crystal and that is manipulated during the manufacturing process so that the photons being emitted by the material 16 are at an optimum wavelength (and thus color) to maximize the efficiency of the nuclear-cored battery 10. One example of how the crystalline structure is manipulated is by adding $MO.(Al_2O_3)$:Eu,R to the ceramic phosphor material, wherein M is chosen from one of the alkaline metals such as strontium, calcium, and barium; R is any of the lanthanides; Eu is present at a level from about 0.05% to about 10% by weight and preferably 0.1-5% by weight; and R is present at a level from about 0.05% to about 10% by weight and preferably 0.1-5% by weight. Thus the final formula of the ceramic phosphor material will comprise the matrix $MO.(Al_2O_3)$:C:Eu,R.

Another example of a material that is added to the ceramic phosphor material 16 to manipulate the output frequency of the photons being emitted is yttrium oxysulfide doped with titanium and magnesium material that forms a crystal that emits red to orange wavelengths of light. Thus for red and orange wavelengths the ceramic phosphor material comprises the matrix MOS:Mg,Ti,Eu wherein MO is chosen from a group consisting of MgO, ZnO, ZrO, CuO, Yttrium Oxide, or Gallium Oxide.

The excitation of the base light emitter, such as $Al_2O_3$:C, causes the stimulation of the crystals and the combined frequency gives the final output color. Thus the output frequency of the ceramic phosphor material 16 is manipulated to any color in the visible spectrum. Below is a list of examples of different ceramic phosphors and the color wavelengths of the photons that are emitted by each depending on the amount of each element provided:

1. Green—A mixture of polycrystalline carbon doped Alumina, Europium Oxide, Strontium Carbonate, and Dysprosium Oxide.
2. Blue—A mixture of polycrystalline carbon coped Alumina, Europium Oxide, strontium Carbonate, and Dysprosium Oxide.
3. Yellow—A mixture of polycrystalline carbon doped Alumina, Europium Oxide, Strontium Carbonate, Barium Carbonate, and Dysprosium Oxide.
4. Orange—A mixture of polycrystalline carbon doped Alumina, Yittrium Oxysulfide, Europium Oxide, Strontium Carbonate, and Dysprosium Oxide.
5. Red—A mixture of polycrystalline carbon doped Alumina, Yttrium Oxysulfide, Europium Oxide, and Magnesium Titanium.
6. White—A mixture of polycrystalline carbon doped Alumina, Europium Oxide, Strontium Carbonate, Neodymium Oxide, and Dysprosium Oxide.
7. Violet—A mixture of polycrystalline carbon doped Alumina, Europium Oxide, Calcium carbonate, and Neodymium Oxide.

Thus, each combination listed creates a separate crystalline structure or crystal depending upon the content of each element present. Each crystalline separately is unique in its interaction with different radiations produced by the nuclear core 14, and each will produce a different wavelength of visible light emitted from the crystalline.

Surrounding the ceramic phosphor material 16 is a photovoltaic layer 18 that transforms the photons into a flow of electrons to create an energy source, or sphere 12. One will appreciate that in one embodiment the photovoltaic layer 18 is made of an amorphous silicon that also is altered with defects by, for example, doping the material with magnesium in order to manipulate a stimulating frequency of the photovoltaic layer 18. Other examples of defects include titanium and chromium. Thus the output frequency of the photons generated by the ceramic phosphor material 16 is manipulated or tuned while manipulating or tuning the stimulating frequency of the photovoltaic layer 18 so that the most efficient amount of light created by the ceramic phosphor material 16 is converted into an electron flow by the photovoltaic layer 18.

After a plurality of spheres 12 are created a battery is formed by surrounding a plurality of spheres 12 with a conductive material 20 that is an intermediate layer that carries the spheres 12. This conductive material 20 comes into direct contact with the spheres 12 and in one embodiment is a conductive polymer, one example of which is a sulfidized polymer. One such conductive polymer is poly(3,4-ethylenedioxythiophene) polystyrenesulfonate. A P and N layer 22 comprising a P layer 22a and an N layer 22b sandwiches the spheres therebetween to harness the electron flow created by the photovoltaic layer 18 to create the nuclear-cored battery 10. Additionally, a layer of insulating material 23 can be used to surround the P and N layer 22.

Finally, spheres 12 in one embodiment are in powder form and will range in size from 50 microns to sub micron in size depending on the application and output. Nonetheless, in another embodiment a metal is added to the nuclear core 14 of the battery 10 in order to increase the size of the spheres 12 for macro-sized applications.

Figure 3:
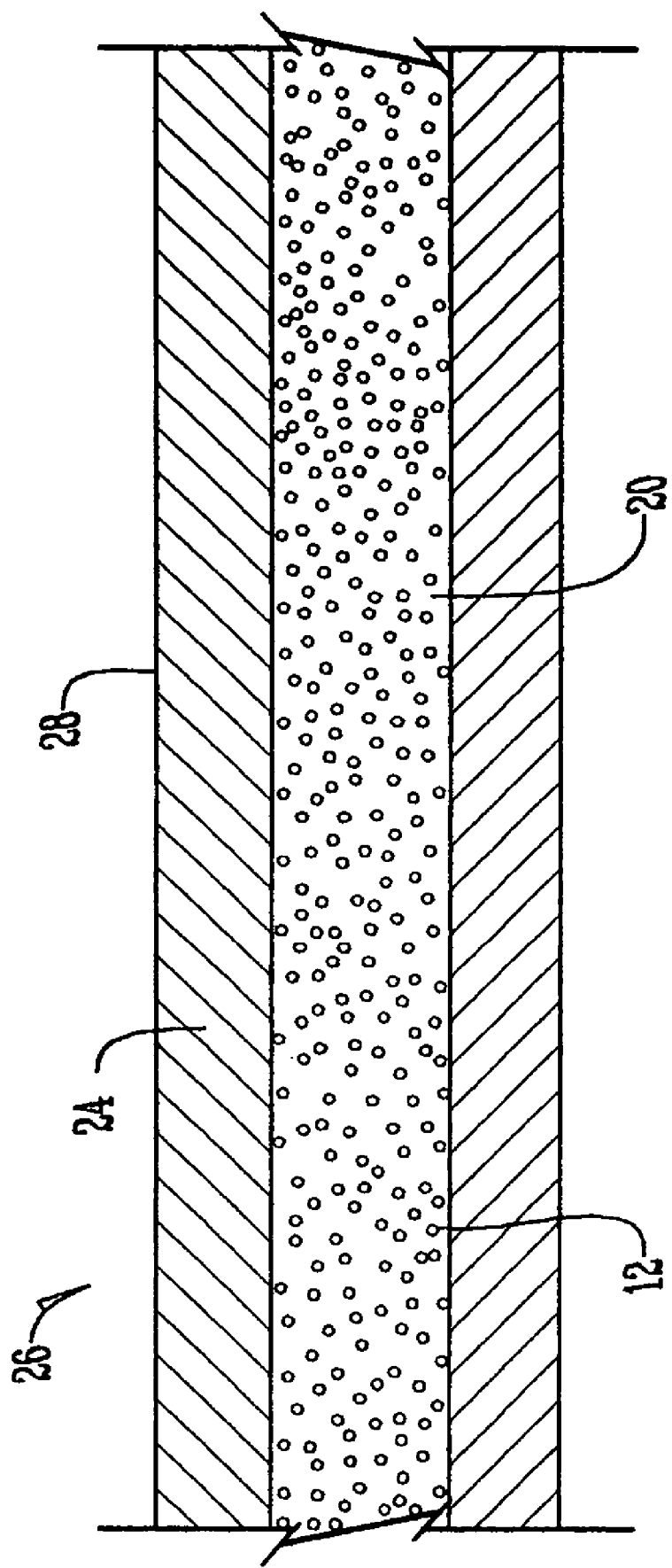
FIG. 3 is a sectional view of a super magnet.

As shown in FIG. 3, in an alternative embodiment a magnetic material 24 is placed around the plurality of spheres 12 to create a super magnet 26. Specifically, the flow of electrons created by the photovoltaic layer 18 interacts with the magnetic material 24 to magnetize the outer surface 28 of the magnetic material 24.

In operation, the nuclear core 14 emits radiation, for example, beta radiation that is an electron. When the electron comes in contact with the ceramic phosphor material 16 the radioactive radiation is stopped by the ceramic, yet the electron excites the phosphors causing an electron to "jump" from a 4d valence energy level to a higher valence energy level within a phosphor. When that electron "settles" back to its original 4d state, energy in the form of a photon is emitted. When the ceramic phosphor material 16 includes a carbon defect in its matrix the carbon defect increases the bandwidth of the phosphor allowing more photons to be generated. Furthermore, the matrix of the ceramic phosphor material 16 will determine the frequency of the photon that is being emitted from the ceramic phosphor material 16. These photons are then absorbed by the photovoltaic layer 18 to create an electron flow that is harnessed by the P and N layer 22 to cause the battery 10 to function.

When other radioactive radiations are present such as gamma and alpha radiation, the phosphors still become "excited" and produce photons, but not in the same way as beta radiation. Thus all types of radioactive material may be used as the nuclear core 14.

Figure 4:
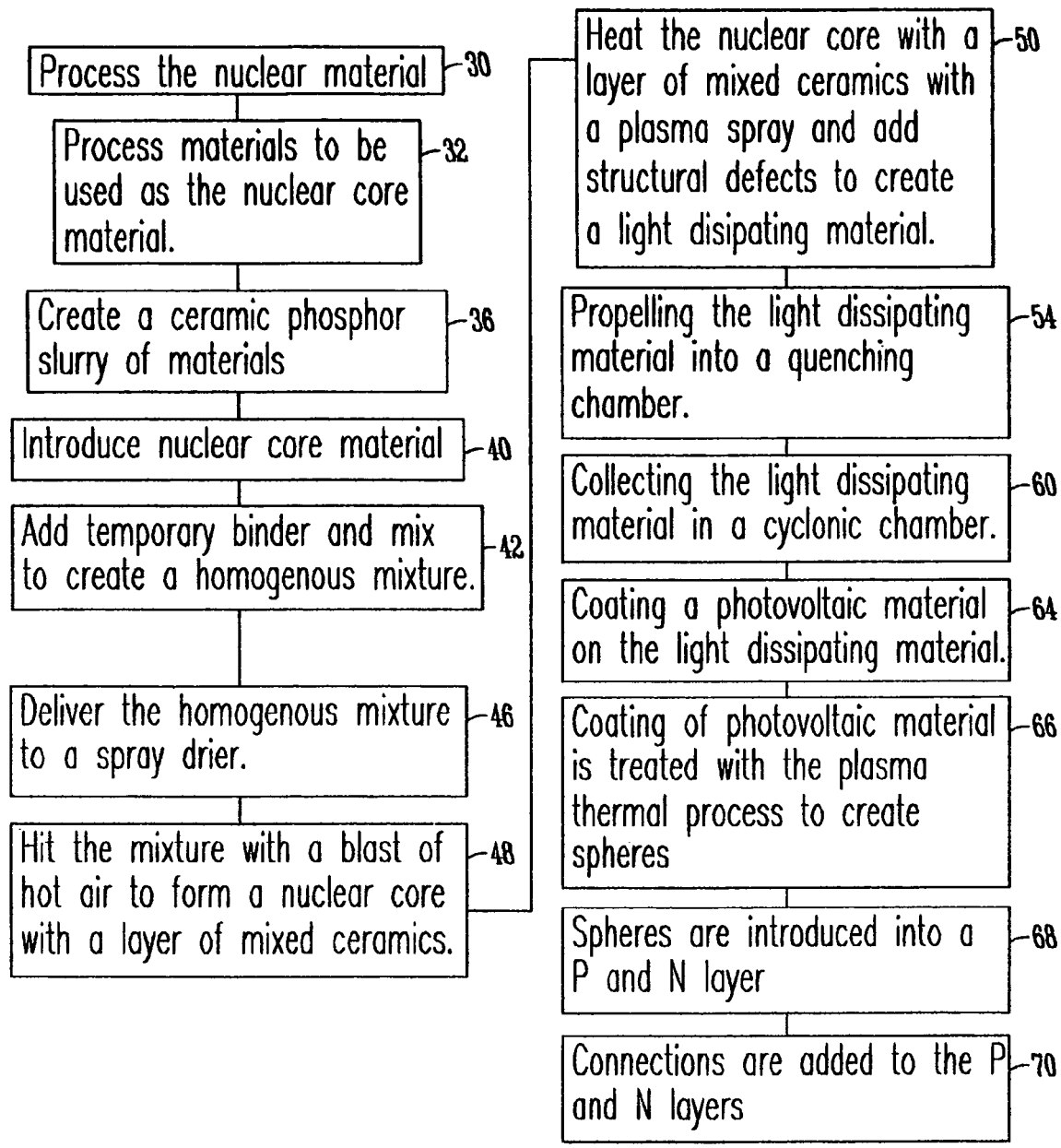
FIG. 4 is a flow diagram of a manufacturing process of a nuclear-cored battery.
Figure 5:
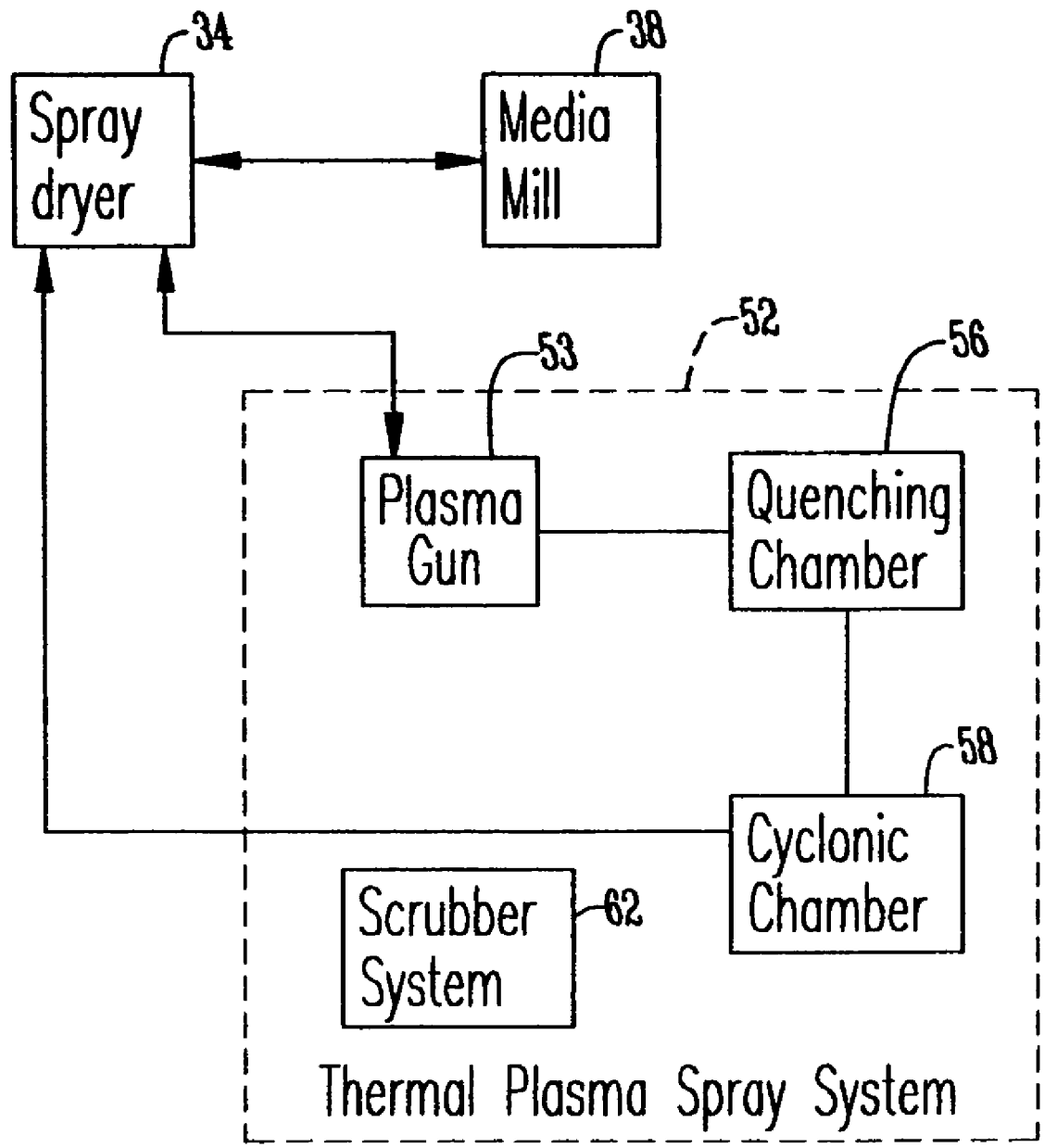
FIG. 5 is a schematic diagram of the equipment used during the manufacturing process of a nuclear-cored battery.

Manufacturing the nuclear-cored battery involves a multi-step process. FIG. 4 shows a flow chart of the multi step process used during the manufacturing of the battery and FIG. 5 shows a schematic diagram of the equipment used during this process. Processing the nuclear material is the first step 30. This is preformed in a multitude of ways depending on the initial source. If the nuclear material is of a mixed matrix of different radiation sources division is made by dissolving the materials with the mixed matrix and separating these materials via gravimetric. The weight and density of the different materials in the mixed matrix causes these materials to separate into layers making it possible to divide materials as needed.

The next step 32 is to process the nuclear material via a spray dryer 34 into a spherical metal or compound to be used as the nuclear core 14. The core 14 in one embodiment is a compound that is an oxide or carbonate that creates a stronger structure, with a higher melting point than the metal that the oxide or carbonate are derived from. Other methods and equipment such as a precipitation method or some other form of sprayer is also used to create the nuclear core 14.

At step 36 a ceramic phosphor slurry material that in one embodiment is made of a base material of $Al_2O_3$:C and phosphors is created. The ceramic phosphor slurry is a frequency alternating mixture that in one embodiment comprises strontium carbonate, europium oxide, dysprosium oxide, or the like (depending on the output frequency desired) that is mixed into a water and alumina powder. The ceramic phosphor slurry, water and alumina powder are milled together to a nano mean size to form a ceramic phosphor slurry material. This is preformed in a media mill or mixing chamber 38 or other systems. In one embodiment a carbon defect is added to the ceramic phosphor slurry material by using graphite, or another carbon additive while making the ceramic phosphor slurry.

At step 40 the nuclear core material is introduced to the ceramic phosphor slurry material and then at step 42 a temporary binder is added (ammonia nitrate or another gas is used to create a porous structure as necessary) and the ceramic phosphor slurry material with a nuclear core material having a temporary binder is then mixed to create a homogenous mixture. Examples of the temporary binding material are methyl cellulose, poly vinyl alcohol, or the like.

This homogenous mixture is processed again through the spray drier 34 to dry the homogenous mixture to form an outer shell at step 46. At step 46 the homogenous mixture is delivered to the spray drier 34 and into the cavity of the spray drier 34 by double annulus spray nozzle or discharge wheel. The homogenous mixture is then hit with a blast of hot air that evaporates the water within the homogenous mixture and dries the temporary binding material at step 48 to form a temporarily bound layer of mixed ceramics. Atmospheric gas of nitrogen, argon, and/or carbon dioxide is used to assist in the process. In the embodiment wherein the base ceramic is $Al_2O_3$:C step 48 forms a semi ridged spherical particle with the nuclear core 14 surrounded by a temporarily bound layer of mixed ceramics having an alumina structure.

At step 50 the particle created at step 48 is subjected to a high temperature portion of the processing, or plasma thermal process using a thermal plasma spray system 52 having at least one plasma gun 53. With temperatures that are adjusted from 2,000 to over 15,000 centigrade the mixed ceramics from step 48 are brought to a molten state for a short amount of time, preferably under a minute, thus creating a layer of mixed ceramics in a molten state. While in this molten state the temporary binding material will burn out and the nuclear core with the layer of mixed ceramics becomes an amorphous structure as a result. The plasma stream sinters the layer of mixed ceramics to densify and calcinate or purify the layer. In one embodiment the layer of mixed ceramics has an alumina structure and this alumina structure is brought to a molten state for a short amount of time creating the amorphous structure.

While the particle created at step 48 is subjected to the high temperature portion of the processing structural defects are introduced. In one embodiment these defects include carbon defects and/or lanthanide defects. Once a carbon defect is added the layer of mixed ceramics in combination with the nuclear core 14 becomes a light dissipating material 17. Thus, the nuclear core 14 after this high temperature processing will no longer be radioactive in nature past the layer of mixed ceramics. The radioactive decay will be transformed into light that is emitted out from the light dissipating material 17.

During step 54 the light dissipating material 17 is propelled into a quenching chamber 56 and a pair of cooling nozzles that in one embodiment emit a crosscurrent of quenching gas that is an air and gas mixture cools and incepts further amounts of carbon into the light dissipating material 17 to form a crystalline structure or crystal. One will also appreciate that the temporary binder provided some carbon content as it burned out but the use of carbon dioxide in the quenching gas will allow for total coverage of carbon within the light dissipating material 17. Also the use of nitrogen, or other inert gas, as a quenching gas will encourage the clarity of the crystalline structure or crystal allowing for a higher transfer of light from the light dissipating material 17. Rather than add the carbon defect in step 52, alternatively the carbon defect is added just in step 54. The heating of the nuclear core with a layer of mixed ceramics allows the introduction of the carbon defect at step 52, step 54, or both. The light dissipating material 17 now quenched and treated with the chamber gasses is collected by a cyclonic chamber 58 that is separate from the quenching chamber 56 at step 60. The light dissipating material 17 is then removed when collected.

Construction material in the quenching chamber 56 will be similar to that of the spray drier 34. Additionally, a scrubber system 62 is utilized to prevent the discharge of uncoated nuclear core particles in both the spray dry process and thermal plasma spray stages.

Once the light dissipating material 17 is created the material is spray dried with a coating of photovoltaic material such as silicon by the spray dryer 34 at step 64. At step 66 this layer is treated again with the thermal plasma process to densify the silicon on the light dissipating material 17 to create the photovoltaic layer 18, thus creating the sphere 12. By using the thermal plasma process the photovoltaic layer in one embodiment has an amorphous structure. This layering technique will allow for a high strength and small particle size with each layer interacting with the next. The spray dryer 34 gives the spheres 12 their shape and one will understand that these small spherical particles are in one embodiment the form of a powder.

At step 68 the finished powder is sandwiched between organic P and N layers 22 to draw away the electrons being discharged from the photovoltaic layer 18 of the spheres 12. Leads are connected to the P and N layers 22 to transport energy to a source consumer of the electricity at step 70. The P and N layers 22 in one embodiment are applied as a spray and conform to any shape desired or as a sheet 72 (FIGS. 7 and 8) that is later inserted into a commercial product.

One will appreciate that though this method of manufacturing places a ceramic phosphor layer 16 over a nuclear core 14 to form a light dissipating material 17, that in another embodiment only the ceramic phosphor slurry undergoes the manufacturing process described to create a ceramic phosphor crystal 16. This crystal 16 is then used in association with the nuclear core 14 to create a light dissipating material 17.

Figure 6:
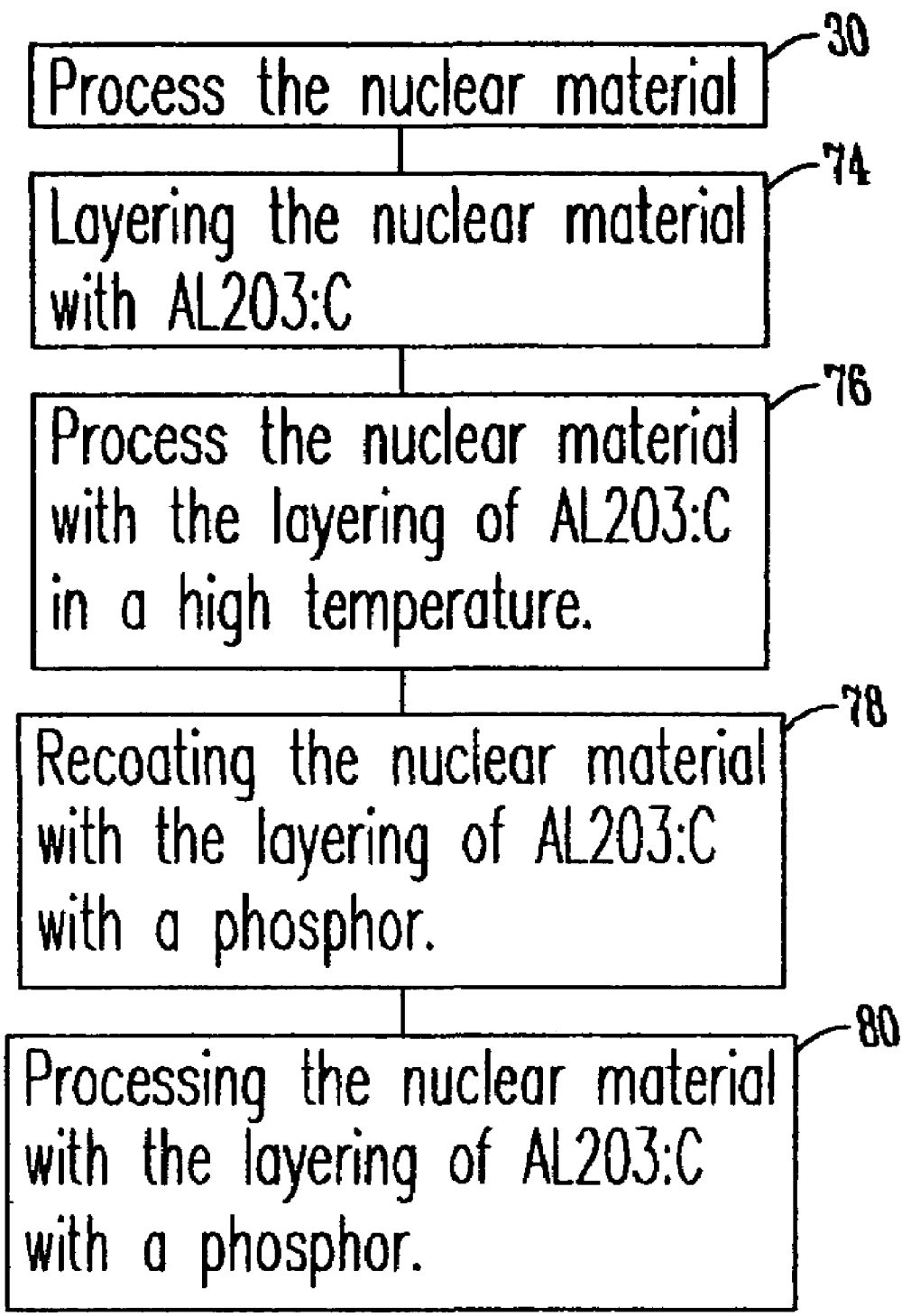
FIG. 6 is a flow diagram of a manufacturing process of a nuclear-cored battery.

In another embodiment seen in FIG. 6 the nuclear material is layered with the $Al_2O_3$:C first in step 74, then processed in high temperature in step 76, then recoated with the phosphor in step 78, and processed with higher temperatures to alter the output frequency at step 80. The mixing of a matrix of materials is used on low to mid output radioactive materials but high output materials will require the shielding first then the altering of the frequency. This also offers an opportunity to manipulate a carbon defect in the alumina layer. The use of pre-manufactured materials exists to create these layers. Again, a binder is used to hold the layers together temporarily until high temperature processing is implicated.

The use of a discharge circuit in one embodiment is utilized to remove unused excess electricity created by the nuclear-cored battery 10. This electricity is converted to heat or other forms of energy to dissipate excess capacity. This energy could also be redirected to a capacitor to store the electricity during sporadic and inconsistent use of the source. The reason for the use of this circuit is that the battery 10 is going to give electricity continuously without delay for the duration of the core materials' half-lives.

Figure 7:
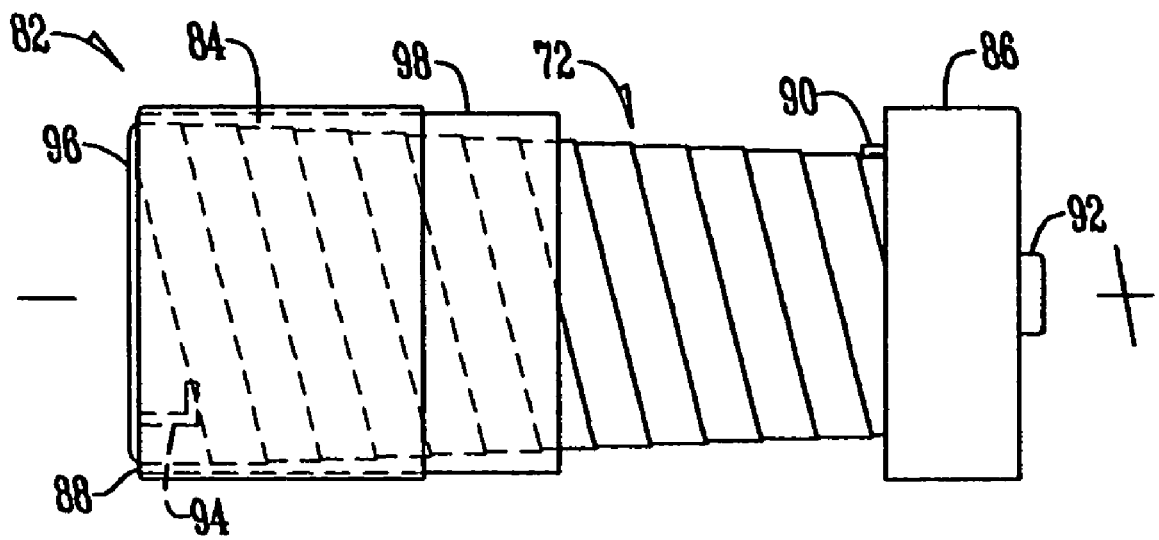
FIG. 7 is a plan side view of one embodiment of a disposable battery using a layered nuclear-cored battery.
Figure 8:
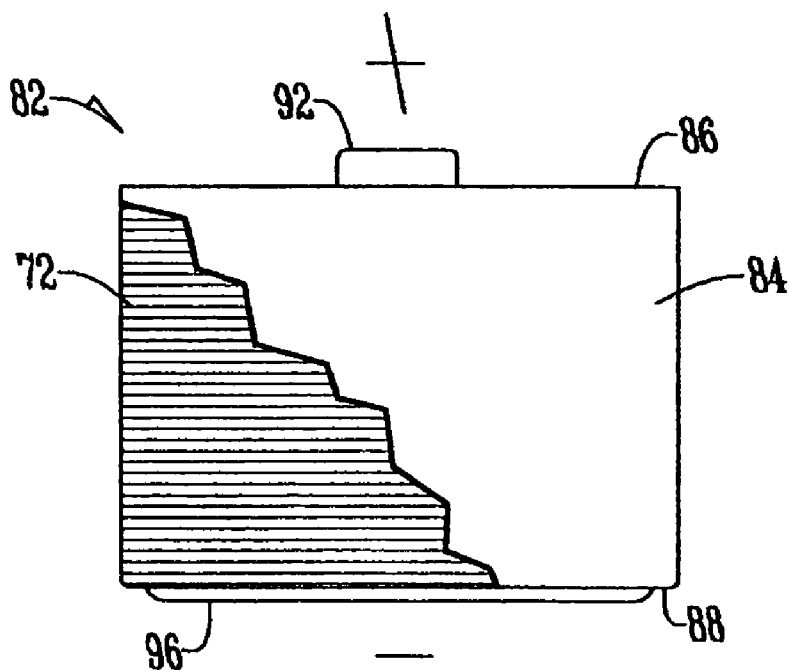
FIG. 8 is a cut away plan side view of one embodiment of a disposable battery using a layered nuclear-cored battery.

FIGS. 7 and 8 show embodiments wherein a layered battery 82 is formed. Specifically, in this embodiment the P and N layers are applied as a spray to form a nuclear core energy source sheet 72. In this embodiment the sheet 72 is rolled or coiled into a cylinder and inserted into a plastic or metal housing or case 84 having a first and second ends 86 and 88. FIG. 7 shows the coiled sheet 72 outside the case 84 and tapered; however, in use the sheet is coiled and within the case 84. A first conductive lead 90 is electrically connected to the P layer 22a and is attached to the first end 86 to create an anode 92 and similarly a second conductive lead 94 is electrically connected to the N layer 22b and attached to the second end 88 to create an electrode 96. One will understand that a layer of insulating material 98 may be attached to the case 84 to insulate the case 84 from the sheet 72.

As shown in FIG. 8, in another embodiment a plurality of sheets 72 are stacked upon or are adjacent to each other within the case 84. In this embodiment the first end 86 of the case will come into contact with a P layer 22a of a sheet 80 to form the anode 92 and the second end 88 will come into contact with a N layer 22b of another sheet 72 to form the electrode 96. In this embodiment, if an insulating layer is desired, conductive leads are used to connect the P layer 22a to the first end 86 of case 84 and to connect the N layer 22b to the second end 88 of case 84.

Other products that can be produced from this source of energy are: room temperature super conductors, super conducting cables/wires, resistance free polymers, infinitely formable power supplies, energy sources for: electronics, houses, cities, countries, automobiles and other forms of transportation.

When in use the product life, whether a battery, or another product using the energy source disclosed above, is determined by the material(s) of the nuclear core 14. Therefore, a manufacturer by selecting the nuclear core material has the ability to pre-select a time limit that a product will function. This is accomplished by first testing nuclear materials by carbon dating or the like to determine a half life for the materials to provide nuclear materials having known half lives. Then a nuclear material having a known half life is selected and used as a nuclear core 14 of a nuclear-cored battery 10. Thus, once this nuclear core ceases to produce effective radioactive radiation the product will shut down.

Another way of pre-selecting the time limit of a product that is produced from the above energy source is to attach a timing mechanism such as a timing circuit to the product that will terminate the operation of the product after a pre-selected occurrence. In one embodiment the timing mechanism is programmed to disable a product after a pre-selected period of time such as for example 10 years. In an alternative embodiment the timing mechanism disables a vehicle after a pre-selected amount of distance traveled by the vehicle. For example the timing mechanism could sense when a vehicle has driven 50,000 miles and disable the vehicle at that time.

The reason for pre-selecting the life of a product using the energy source 12 is because when a radioactive core material is used, this energy source can have the potential of lasting for trillions of years. Thus, without pre-selecting the time of the life of a product, consumers will have no need to repurchase a product. Furthermore, many devices such as DVDs, personal electronics, and others that could use the energy source 12 involve technologies that are continually being improved. Thus, products having a pre-selected life will allow for the miniaturization of many electronics and the development of new technologies to ensure products remain up to date. Thus to ensure technology will continue to move forward, the products using the nuclear-cored battery energy source 12 will need to have a pre-selected product life.

Figure 9:
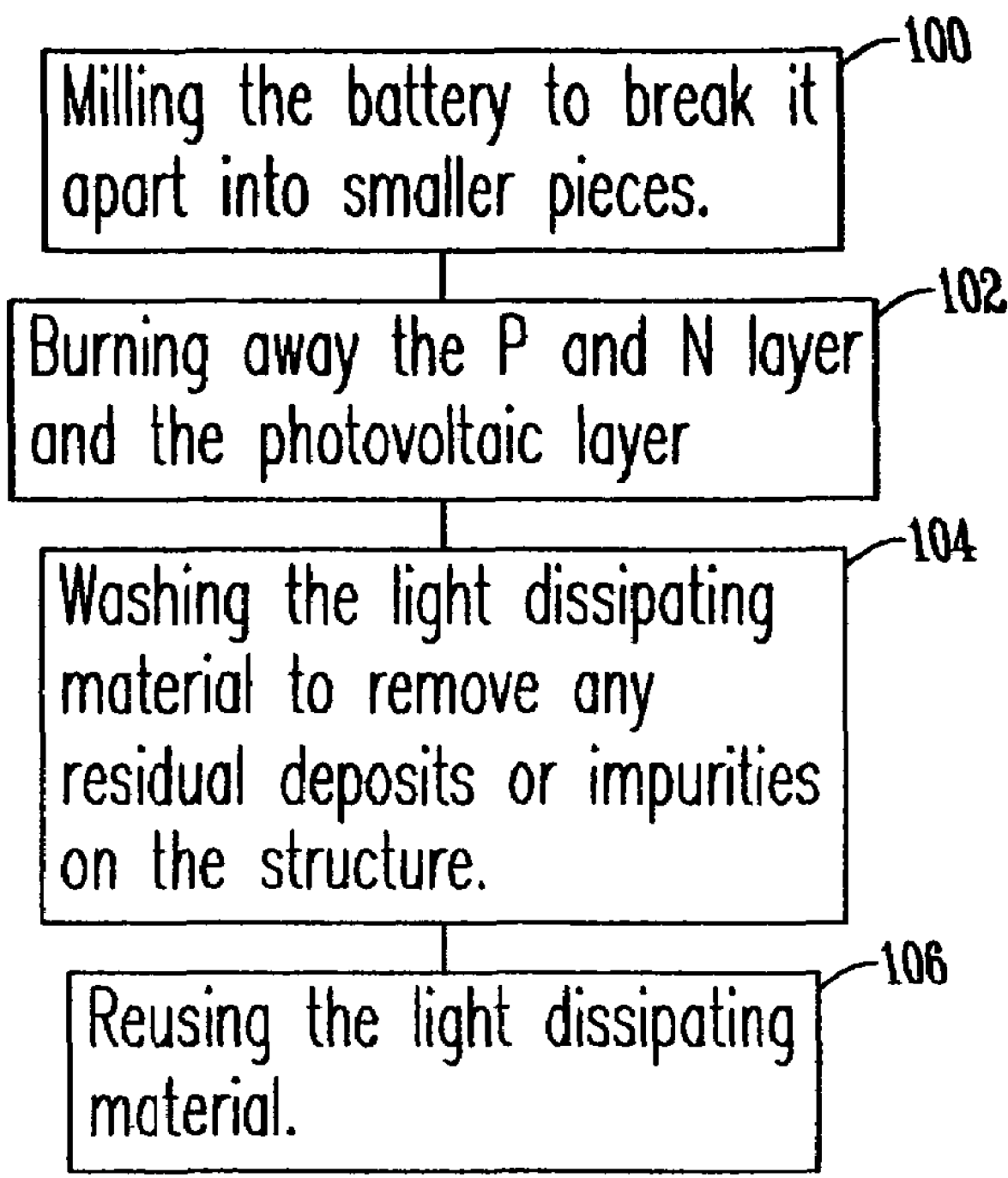
FIG. 9 is a sectional view of a plasma spray gun.

In an embodiment wherein a product uses a timing circuit to pre-select the time of the life of a nuclear cored product, this product will need to be recycled. The steps for recycling a nuclear-cored battery are shown in FIG. 9. Recycling of the nuclear-cored battery can be accomplished by first milling the battery to break it apart into smaller pieces, as represented in step 100. Then the pieces undergo a thermal burn, such as in a kiln to melt away the P and N layer and the photovoltaic layer as shown in step 102. Remaining after the thermal burn is the light dissipating material 17 that is either chemically treated with an acid to etch the ceramic within the light dissipating material 17 or physically treated with a circulating wash to remove any residual deposits or impurities on the light dissipating material such as excess carbon, as shown in step 104. Thus, the light dissipating material 17 may then be reused in another application as shown in step 106.

Figure 10:
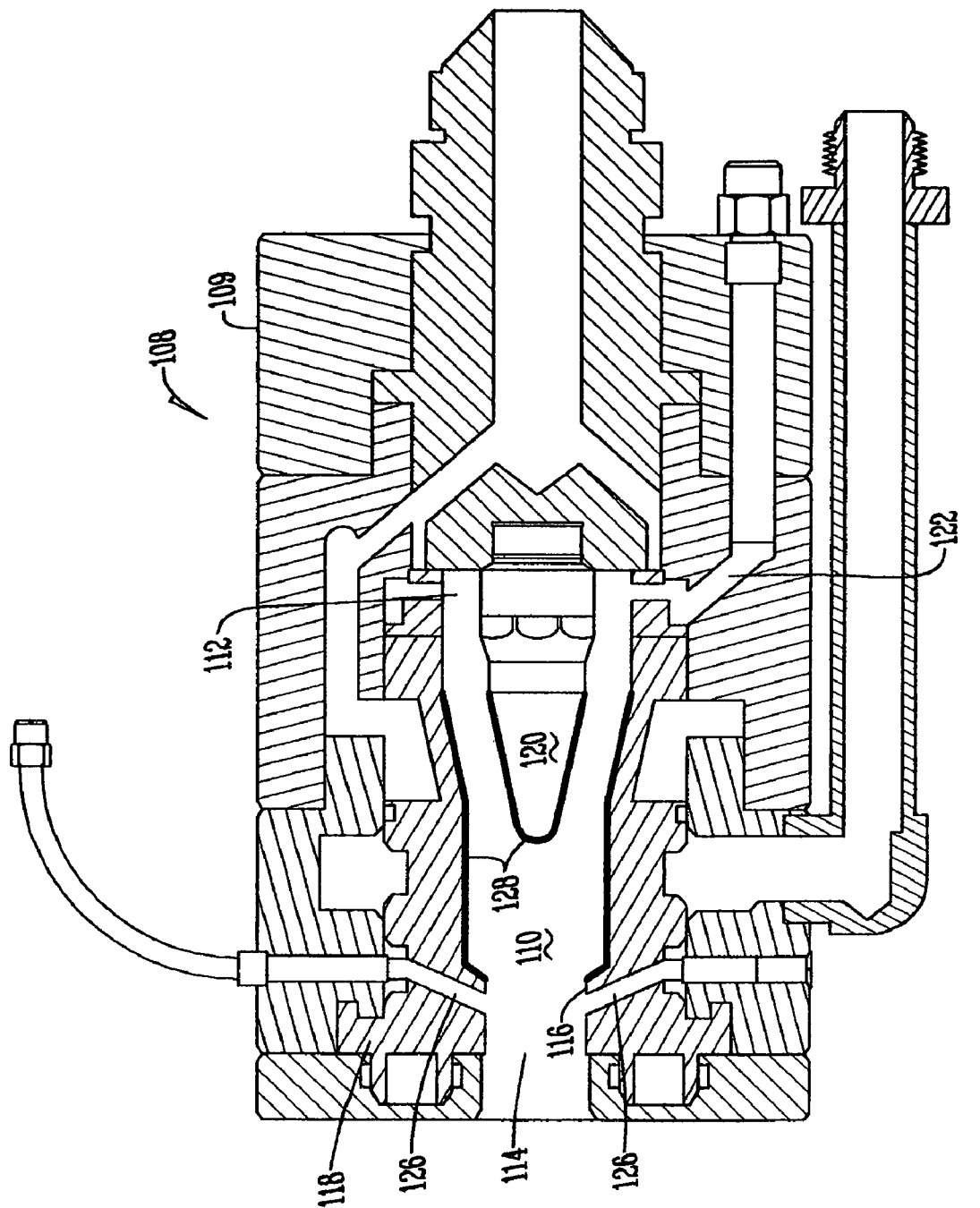
FIG. 10 is a flow diagram of a recycling process of a nuclear-cored battery.

FIG. 10 shows an improved thermal plasma spray gun 108 that is one example of one embodiment of thermal plasma spray gun 53 used during the manufacturing of the nuclear-cored battery 10. The plasma spray gun 108 has a housing 109 with a plasma stream conduit 110 that extends from an inlet end 112 to a discharge end 114 having a discharge aperture 116. Within the plasma stream conduit 110 is a discharge dielectric anode 118 and a discharge dielectric electrode 120. In communication with the plasma stream conduit 110 are gas feed conduits 122 that extend through the housing 109 of the plasma spray gun 108 such that a single gas, or mixture of gasses, is exposed to the anode 118 and electrode 120 within the plasma stream conduit 110 to create a stream of plasma therein. Supply conduits 126 extend through the plasma spray gun 108 and are in communication with the discharge end 114 of the plasma stream conduit 110 to supply powdered metals or ceramics to the plasma stream to create a molten material.

A voltage supply is electrically connected to the plasma stream conduit 110 to supply voltage to the conduit 110 to create an electrostatic discharge that will convert feed gases into a plasma stream. This voltage supply may be integrated as a circuit that is part of the plasma gun 108 or may be a voltage supply that is remotely located from the plasma gun 108

Hydrogen, nitrogen, helium, and/or argon are used to produce the plasma stream. A hydrogen nitrogen combination will generate sufficient heat with the ability not to interact with the structure and alter the nuclear core with a layer of mixed ceramics introduced to the plasma spray gun 108. A high-energy electrostatic discharge through the gas causes the plasma phase of the gas to be generated. The gas is then ejected from the plasma stream conduit 110 of the plasma spray gun 108, and metallic or ceramic powders are introduced into the stream via the supply conduit 126 where the heat is transferred to the powders.

The anode 118 and electrode 120 create an electrostatic discharge causing the formation of the plasma gas. During this electrostatic discharge high amounts of energy cause a pitting of the surfaces of the anode 118 and electrode 120. To solve this problem the anode 118 and electrode 120 are milled to remove 2-20 mills and a dielectric material such as alumina is deposited onto the anode 118 and electrode 120 surfaces to create a dielectric barrier 128, preventing the pitting from the discharge of the static field, thus increasing the efficiencies of the unit and allowing for a higher purity in the end product. This dielectric material may be applied to the anode 118 and electrode surfaces using a thermal plasma process to spray molten dielectric material onto the anode 118 and electrode 120. Furthermore, in one embodiment the dielectric material may be doped with another material, such as for example, magnesium.

Figure 11:
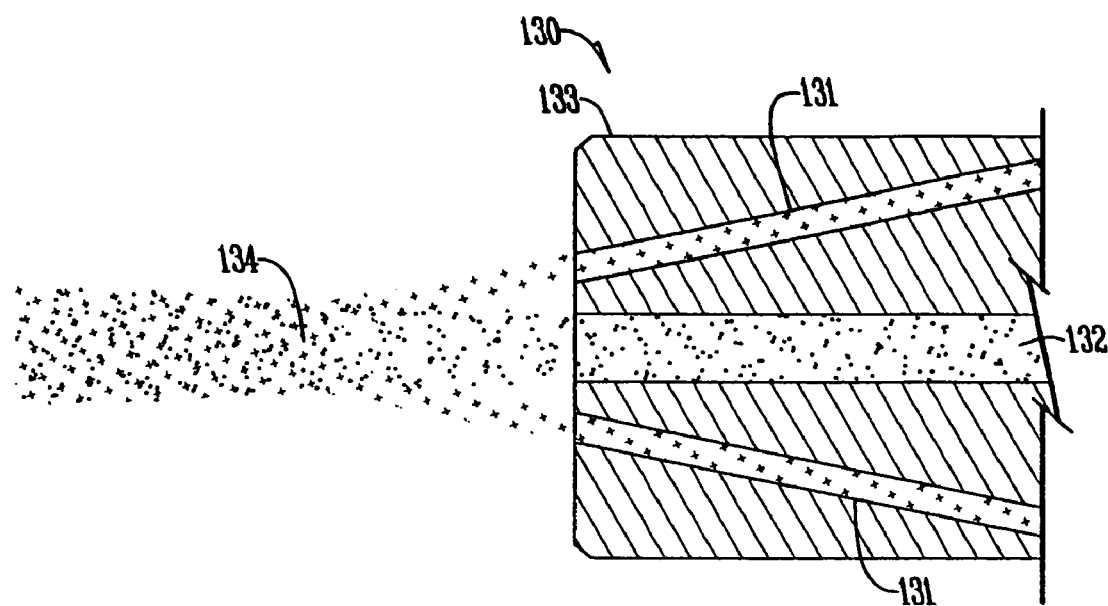
FIG. 11 is a side plan cut away view of a plasma spray system.

FIG. 11 shows a reconfigured plasma spray system 130 that is an example of one of the embodiments of plasma spray system 60 that is used during the creation of the nuclear-cored battery. Specifically, this embodiment shows a reconfigured plasma system 130 that will more efficiently handle a liquid stream of material thus creating a wider spray area. By using this configuration the spray dry process may be eliminated from the processing.

Specifically, the plasma spray system 130 of FIG. 11 shows a plurality of smaller plasma jets 131 that are configured in a 3-12 inch diameter around a centrally located jet 132 that is a liquid generating device within a housing 133. The jets 131 are one embodiment of the spray gun 108 shown in FIG. 10 that generate a plasma stream by utilizing an anode 118 and electrode 120 in combination with gases from gas feed conduits 122 within a plasma stream conduit 110 having a inlet end 112 and discharge end 114. Similarly, the centrally located jet 132 is also one embodiment of the spray gun 108 wherein a material powder, such as metallic powder is fed into the discharge end 114 of the plasma stream conduit 110 via supply conduit 126 so that molten, or liquid metal is discharged by the liquid generating device 132. In one embodiment the centrally located jet 132 has a double annulus spray head that generates a stream of atomized liquid.

The plurality of plasma spray jets 131 are positioned so that their plasma streams will intersect at a point 134 along the path of the atomized liquid and thus become part of the atomized liquid stream. With this system in place a smaller particle is produced and fewer steps are required to produce the same product.

Figure 12:
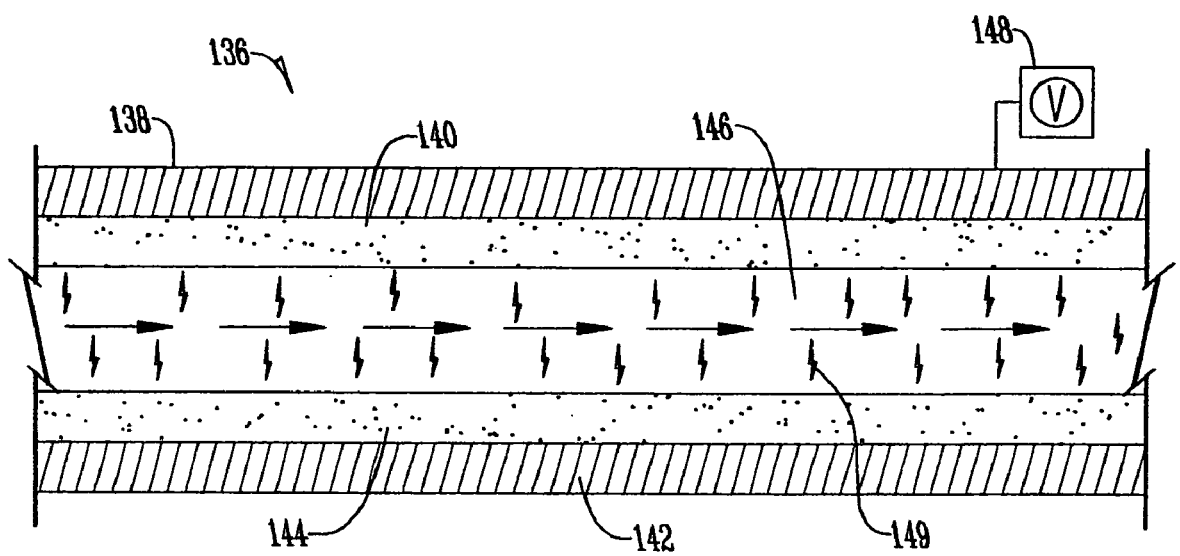
FIG. 12 is a sectional view of a decomposition cell.

FIG. 12 shows a decomposition cell 136 that functions to cause the decomposition and production of materials in a discharge field. The decomposition cells 136 are placed in a conduit in order to break pollution down into its simplest components to minimize pollution. For example, in one embodiment, a decomposition cell 136 is placed in a smoke stack of a manufacturing facility to convert pollutants into environmental safe oxygen or carbon.

The decomposition cell 136 of FIG. 12 is manufactured by taking a first metal plate 138 such as copper and using a plasma gun 53 or 108 to spray a molten dielectric material such as alumina onto the metal plate 138 to create a first dielectric layer 140. One will appreciate that by using the plasma spray gun 53 or 108 to spray the molten dielectric material on the metal plate 138, an optimum contact area between the dielectric layer 140 and the plate 138 is achieved to create a more efficient decomposition cell 136. Furthermore, by using the plasma spray gun 53 or 108, magnesium oxide may be doped into the molten dielectric material such as alumina to further increase the efficiency of the decomposition cell 136. Similarly, the molten dielectric material is then sprayed onto a second metal plate 142 to create a second dielectric layer 144.

Next the plates 138, 142 are placed in parallel spaced relation to create a discharge area 146 wherein air is able to flow through the cell 136. Thus during a discharge process, when the two metal plates 138, 142 are electrically connected to a high voltage high frequency source 148 and when voltage is supplied to the two metal plates 138, 142 an electrostatic discharge 149 occurs in the discharge area 146, thus decomposing pollutants flowing therethrough and filtering the air. One will appreciate that the high voltage high frequency source 148 may be supplied by a circuit that is part of the decomposition cell 136 or a by a voltage source remote to the cell 136.

Figure 13:
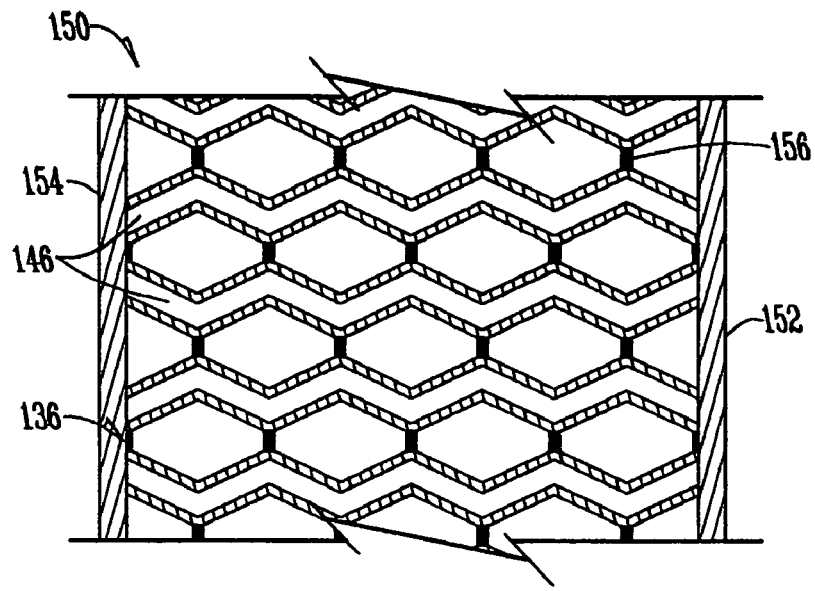
FIG. 13 is a sectional view of a decomposition unit.

As best shown in FIG. 13, a plurality of decomposition cells 136 are placed together to form a decomposition unit 150. The decomposition unit 150 of FIG. 13 has a honeycomb configuration of decomposition cells 136 that extend between first and second side walls 152, 154 thus creating a plurality of discharge areas 146 that can be separated by an insulating material 156. Because of the plurality of discharge areas 146 in combination with the honeycomb configuration of the unit 150 the surface area of the discharge area 146 within the decomposition unit 150 increases, thus causing more pollutants to be decomposed as the pollutants flow through the decomposition unit 150.

Figure 14:
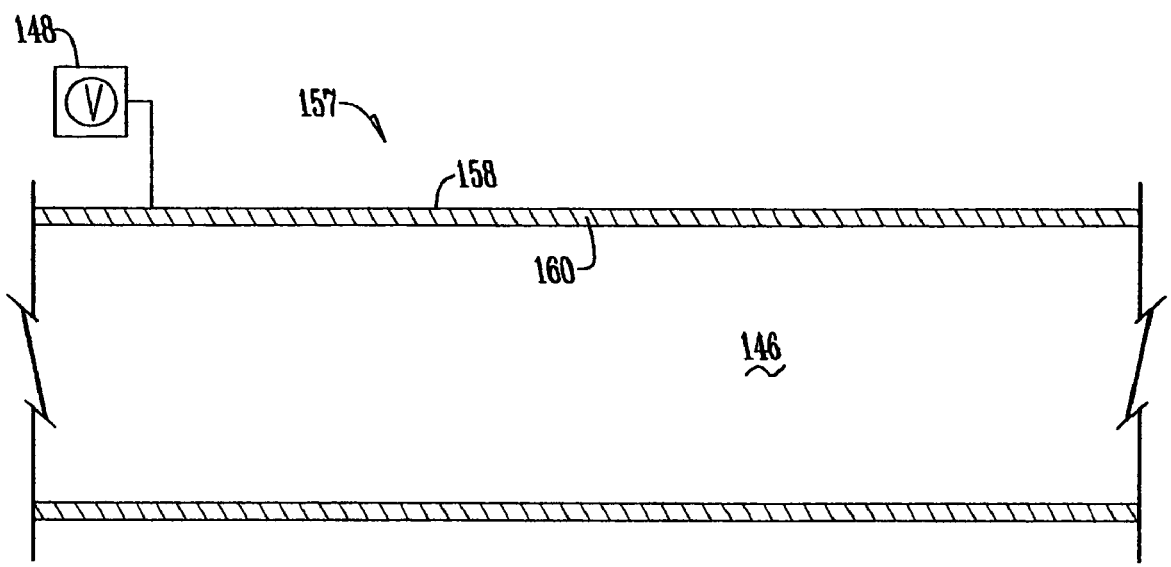
FIG. 14 is a sectional view of a fuel saver.

In one embodiment shown in FIG. 14, the decomposition cell 136 is used primarily to convert $O_2$ to $O_3$. In this embodiment the decomposition cell 136 is referred to as a fuel saver 157. The fuel saver 157 specifically is created by taking a rolled copper body 158 and thermally applying an alumina matrix 160 thereto. One will understand that by thermally applying the alumina to the rolled copper the surface area between the copper and alumina is increased while minimizing the gap between the copper and alumina matrix. Additionally, the alumina is doped with magnesium oxide to change the oxygen state in the final product from an $O_3$ thus yielding a higher output during the discharge process. Because $O_3$ has more chemical bonds than $O_2$, $O_3$ burns much more intensely than $O_2$. Thus a fuel saver is used in an engine to convert $O_2$ to $O_3$ within the engine to provide an improved fuel system that creates optimum gas mileage for the engine.

It will be appreciated by those skilled in the art that other various modifications could be made to the device without the parting from the spirit in scope of this invention. All such modifications and changes fall within the scope of the claims and are intended to be covered thereby.

What is claimed is:

1. An energy source, comprising:
   a plurality of spheres, wherein each sphere comprises:
   a spherical core of nuclear material;
   a ceramic phosphor layer surrounding the spherical core, said ceramic phosphor layer serving to shield radiation emitted from the core by absorbing said radiation and converting said radiation to photons;
   a photovoltaic layer surrounding said ceramic phosphor layer for converting said photons into a spherical flow of electrons; and
   a conductive material surrounding said photovoltaic layer; and P and N layers sandwiching the conductive layer therebetween for harnessing the electron flow created by the photovoltaic layer.

2. The energy source of claim 1, wherein the ceramic phosphor layer comprises a high temperature ceramic material.

3. The energy source of claim 1 wherein the ceramic phosphor comprises a matrix $MO.(Al_2O_3)$:EuR wherein M is an alkaline metal and R is a lanthanide. wherein M is an alkaline metal and R is a lanthanide.

4. The energy source of claim 3, wherein the alkaline metal comprises a mental selected from the group consisting of strontium, calcium and barium.

5. The energy source of claim 1 wherein the photovoltaic layer comprises an amorphous silicon.

6. The energy source of claim 1 wherein the core of nuclear material comprises a beta emitting nuclear material.

7. The energy source of claim 1 wherein the core of nuclear material comprises a gamma emitting nuclear material.

8. The energy source of claim 1 wherein the core of nuclear material comprises an alpha emitting nuclear material.

9. The energy source of claim 1 wherein the ceramic phosphor layer comprises a matrix Al2O3:C.

10. The energy source of claim 1 wherein the ceramic phosphor layer comprises a matrix of $MO.(Al_2O_3)$:C wherein M is an alkaline metal.

11. The energy source of claim 10 wherein ceramic phosphor layer includes 0.05% to 10% by weight of europium dopant and 0.05% to 10% by weight of a lanthanide dopant.

12. The energy source of claim 1 wherein the ceramic phosphor layer comprises a matrix MOS:Mg,Ti,Eu wherein MO is selected from group consisting of MgO, ZnO, ZrO, CuO, Yttrium Oxide, and Gallium Oxide.

13. A nuclear-cored battery comprising:
   a solid spherical core of nuclear material;
   a ceramic phosphor layer having a carbon defect to create a light dissipating material surrounding and in direct contact with said spherical core;
   a photovoltaic layer surrounding and in direct contact with the light dissipating material to produce a flow of electrons;
   a conductive material surrounding and in direct contact with the photovoltaic layer; and
   a P and N layers sandwiching to the conductive material to produce electricity;
   wherein the ceramic phosphor layer comprises a high temperature ceramic material.

14. The nuclear-cored battery of claim 13 wherein the nuclear core emits beta radiation.

15. The nuclear-cored battery of claim 13 wherein the nuclear core emits gamma radiation.

16. The nuclear-cored battery of claim 13 wherein the nuclear core emits alpha radiation.

17. The nuclear-cored battery of claim 13 wherein the ceramic phosphor having a carbon defect in part comprises a matrix $MO.(Al_2O_3)$:C wherein M is an alkaline metal.

18. The nuclear-cored battery of claim 13 where the conductive material comprises a sulfidized polymer.

* * * * *